United States Patent
Koji

(10) Patent No.: US 7,239,574 B2
(45) Date of Patent: Jul. 3, 2007

(54) SYNCHRONOUS STORAGE DEVICE AND CONTROL METHOD THEREFOR

(75) Inventor: Shimbayashi Koji, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 43 days.

(21) Appl. No.: 11/317,084

(22) Filed: Dec. 21, 2005

(65) Prior Publication Data

US 2006/0140046 A1  Jun. 29, 2006

Related U.S. Application Data

(63) Continuation of application No. PCT/JP2004/019322, filed on Dec. 24, 2004.

(51) Int. Cl.
*G11C 8/00* (2006.01)

(52) U.S. Cl. .................... 365/233; 365/233.5

(58) Field of Classification Search ............ 365/233
See application file for complete search history.

(56) References Cited

U.S. PATENT DOCUMENTS

| | | | |
|---|---|---|---|
| 5,892,730 A | 4/1999 | Sato et al. | |
| 6,060,916 A * | 5/2000 | Park ........................ | 327/99 |
| 6,094,727 A * | 7/2000 | Manning ................. | 713/400 |
| 6,151,271 A | 11/2000 | Lee | |
| 6,337,832 B1 | 1/2002 | Ooishi et al. | |
| 6,477,107 B1 | 11/2002 | Lee | |
| 6,510,095 B1 * | 1/2003 | Matsuzaki et al. ...... | 365/222 |
| 6,574,163 B2 | 6/2003 | Maeda | |
| 6,618,457 B1 * | 9/2003 | Yi et al. .................. | 375/354 |
| 6,650,594 B1 | 11/2003 | Lee et al. | |
| 6,757,212 B2 * | 6/2004 | Hamamoto et al. ...... | 365/233 |
| 6,882,192 B2 * | 4/2005 | Gau ......................... | 327/141 |
| 2002/0064072 A1 | 5/2002 | Ooishi et al. | |
| 2003/0103407 A1 | 6/2003 | Ooishi et al. | |
| 2006/0250883 A1 * | 11/2006 | Szczypinski ............. | 365/233 |

FOREIGN PATENT DOCUMENTS

| | | |
|---|---|---|
| JP | 10-150350 | 6/1998 |
| JP | 10-302465 | 11/1998 |
| JP | 10-334659 | 12/1998 |
| JP | 11-213668 | 8/1999 |
| JP | 2000-067577 | 3/2000 |
| JP | 2002-304886 | 10/2002 |
| JP | 2003-163584 | 6/2003 |
| JP | 2004-047066 | 2/2004 |
| JP | 2004-258888 | 9/2004 |

* cited by examiner

*Primary Examiner*—Son L. Mai
(74) *Attorney, Agent, or Firm*—Ingrassia Fisher & Lorenz, P.C.

(57) ABSTRACT

In a DDR operation mode, (L−1) count signal BRDYB is inverted to a low level when 1 is subtracted from initial latency (e.g., L=3). As a result, a delayed signal S (N1BD)/S (N1D) in reverse phase to signal S (N1)/S (N1B) is provided and internal clock signal CKI becomes high during the high level period of the second cycle. This is operated in synchronization with both edges of the external clock signal CLK, and output of double the frequency is started. In the external clock signal cycle immediately before completion of counting of initial latency in a count period for initial latency, the internal clock signal CKI is changed over to double the frequency. Validity flag RDY is changed to a high level during a second cycle of the double frequency.

32 Claims, 9 Drawing Sheets

FIG.8

| | M1/M2 | M3/M4 | M5/M6 | |
|---|---|---|---|---|
| SDR MODE | USED | NOT USED | NOT USED | S/D=H OR BRDYB=H |
| DDR MODE | USED | USED | NOT USED | S/D=L, BRDYB=L AND PS=L |
| DDR + PS MODE | USED | NOT USED | USED | S/D=L, BRDYB=L AND PS=H |

SYNCHRONOUS STORAGE DEVICE AND CONTROL METHOD THEREFOR

CROSS-REFERENCES TO RELATED APPLICATIONS

This is a continuation of International Application No. PCT/JP2004/019322, filed Dec. 24, 2004 which was not published in English under PCT Article 21(2).

TECHNICAL FIELD

The present invention relates generally to a synchronous storage device, and more particularly to a synchronous storage device having a control method for switching between a single data rate mode and a double data rate mode, and to a synchronous storage device having a control method for operating in the double data rate mode.

BACKGROUND

Background Art

In the synchronous semiconductor memory device disclosed in Japanese unexamined patent publication No. H11 (1999)-213668 (hereinafter referred to as "Patent Document 1"), a circuit shown in FIG. 9 is used as a control pulse generating circuit. It comprises an internal clock signal generator 150, a frequency divider 152, and a selector 153.

The internal clock signal generator 150 receives an external system clock signal CLK and generates an internal clock signal PCLK_DDR for a double data rate (DDR) operation mode having the same frequency as the external system clock signal CLK. The frequency divider 152 receives this internal clock signal PCLK_DDR, divides its frequency, and generates an internal clock signal PCKL_SDR for single data rate (SDR) operation mode having half the frequency of the internal clock signal PCLK_DDR.

The selector 153, in response to mode control signal/DDR, selects either one of internal clock signal PCLK_DDR for DDR operation mode or internal clock signal PCLK_SDR for SDR operation mode, and provides it as the internal clock signal PCLK.

When operating in DDR operation mode, the mode control signal /DDR has a low level. At this time, a DDR transmission switch 154 of the selector 153 is turned on in response to mode control signal/DDR and mode control signal/DDR inverted by an inverter 158, while a SDR transmission switch 156 is turned off. Therefore, internal clock signal PCLK_DDR for DDR operation mode is provided as the internal clock signal PCLK.

When operating in SDR operation mode, the mode control signal /DDR has a high level. At this time, the DDR transmission switch 154 of the selector 153 is turned off, and the transmission switch 156 is turned on, and internal clock signal PCLK_SDR for SDR operation mode is provided as the internal clock signal PCLK.

Problems to be Solved by the Invention

In the configuration depicted in Patent Document 1, the internal clock signal PCLK_DDR for DDR operation mode generated by the internal clock signal generator 150, and the internal clock signal PCLK_SDR for SDR operation mode provided from the frequency divider 152 are selected by the selector 153 and the internal clock signal PCLK is generated. In the selector 153, in response to the mode control signal/DDR and the signal from the inverter 158 providing its inverted signal, either one of the transmission switches 154, 156 is turned on while the other is turned off.

However, switching the operation mode between the SDR operation mode and the DDR operation mode depends on the transition of the logic level of the mode control signal/ DDR. But since an operational delay may occur in the inverter 158 and transmission switches 154, 156, a time delay may occur between the transition of the mode control signal/DDR and the changeover of the internal clock signal PCLK.

In Patent Document 1, the counting of latency and the generation of various flags are controlled in response to the internal clock signal PCLK. It is necessary, therefore, to control the internal clock signal PCLK operating at double frequency by DDR operation mode and the load may be increased in this circuit configuration for handling the high speed clock.

SUMMARY OF THE INVENTION

Means for Solving the Problems

The invention is devised in light of the background art disclosed herein, and relates to a synchronous storage device having both an SDR operation mode and a DDR operation mode, and operating by changing between these two operations modes. Hence, it is an object thereof to present a control method in a synchronous storage device capable for easily changing between operation modes, and establishing stable DDR operation mode operation easily.

A synchronous storage device in accordance with a first aspect of the invention attempting to achieve the object stated above is capable of switching between a first operation mode accessing in synchronism with either edge of a pulse of an external clock signal and a second operation mode accessing in synchronism with both edges of a pulse of the external clock signal, the synchronous storage device comprising an L–n detector for counting pulses of the external clock signal while counting the initial latency (L) from a start of accessing, and for detecting the number of pulses of the external clock signal (L–n) from the initial latency (L) by subtracting n, where n is a numerical value of 1 or greater in increments of 0.5. An internal clock signal generator couples to the L–n detector for switching an internal clock from a first clock signal for synchronizing with either edge of a pulse of the external clock signal to a second clock signal for synchronizing with both edges of a pulse of the external clock signal in response to the detected signal from the L–n detector when the second operation mode is being set.

In the synchronous storage device in accordance with the first aspect of the invention, when measuring the initial latency (L) by counting pulses of the external clock signal by the (L–n) detector, the number of pulses of the external clock signal (L–n) (subtracting n from the initial latency (L)) are detected and, when a second operation mode is set, the internal clock is changed over from a first clock synchronized with either edge of the external clock signal to a second clock synchronized with both edges of the external clock signal, in response to the detection signal detecting the number of pulses (L–n) by the internal clock signal generator.

A control method for the synchronous storage device in accordance with a first aspect of the present invention is capable of switching between a first operation mode for accessing in synchronism with either edge of an external clock signal and a second operation mode for accessing in synchronism with both edges of the external clock signal, the control method comprising the steps of detecting the number of clock signals (L–n), by subtracting n (n having a numerical value of 1 or higher at increments of 0.5) from the initial latency (L), about the external clock signal, the initial latency (L) being counted from the start, and in the second operation mode, switching the internal clock signal from a first clock signal for synchronizing with either edge of the external clock signal to a second clock signal for synchronizing with both edges of the external clock signal in response to the step of detecting the number of clock signal cycles (L–n).

In the control method for the synchronous storage device in accordance with the first aspect of the invention, when measuring the initial latency (L) by counting pulses of the external clock signal, the number of pulses of the external clock signal (L–n), subtracting n from the initial latency (L) are counted, and, when the second operation mode is set, the internal clock signal is switched from a first clock signal synchronized with either edge of the external clock signal to a second clock signal synchronized with both edges of the external clock signal, in response to the detection of the number of pulses (L–n).

Accordingly, whether in the first or the second operation mode, in response to the counting of the number of pulses (L–n) during the counting period of initial latency (L) counted at one edge of the external clock signal, the internal clock signal is switched from a first clock signal as an internal clock signal in a first operation mode to a second clock signal as an internal clock signal in a second operation mode. During the counting period of initial latency (L), the changeover operation of the internal clock from the first operation mode to the second operation mode can be included, and any extra period is not needed for changeover of the internal clock signal. It is not required to reserve changeover time for switching the operation mode, and an operation mode changeover without a time delay can be realized. It therefore presents a synchronous storage device capable of switching the operation mode easily from the first operation mode to the second operation mode, and a control method therefor.

A synchronous storage device in accordance with a second aspect of the present invention for accessing in synchronism with both edges of an external clock signal includes a basic clock signal generator for providing a pulse signal in response to a signal synchronizing with one edge of the external clock and a delayed signal in a reverse phase to the signal, a half-period notice unit for providing a half-period signal by determining the timing of a half period from one edge of the external clock signal, and a first intermediate clock signal generator for providing a pulse signal in response to the half-period signal and a delayed signal in reverse phase to the half-period signal, wherein a second clock signal is generated in response to the pulse signals provided from the basic clock signal generator and the first intermediate clock signal generator.

In the synchronous storage device in accordance with the second aspect of the invention, a basic clock signal generator provides a pulse signal in response to the signal synchronized with either edge of an external clock signal and a delayed signal in reverse phase to this signal, and a first clock signal in the first operation mode is generated. In addition, a first internal clock signal generator issues a pulse signal in response to the half-period signal and a delayed signal in reverse phase to this half-period signal, and a second clock signal in the second operation mode is generated, together with the pulse signal from the basic clock signal generator. Herein, the half-period signal is a signal detected by a half-period notice unit, and showing the timing of a half period from either edge of the external clock signal.

A control method of the synchronous storage device in accordance with the second aspect of the invention for accessing in synchronism with both edges of an external clock signal comprises the steps of obtaining an internal clock signal by generating a pulse signal in response to a signal synchronizing with one edge of the external clock signal and a delayed signal in reverse phase to the signal, detecting the timing of a half period from one edge of the external clock, and generating a pulse signal and adding to the internal clock signal in response to a signal obtained at the step of detecting the timing of the half period and a delayed signal in reverse phase to the signal.

In the control method of the synchronous storage device in accordance with the second aspect of the invention, a pulse signal is provided in response to the signal synchronized with either edge of the external clock signal and a delayed signal in reverse phase to this signal, and a first clock signal in the first operation mode is generated. Further, a pulse signal is provided in response to the half-period signal and a delayed signal in reverse phase to this half-period signal, and a second clock signal in the second operation mode is generated, together with a pulse signal from the first clock signal generator. Herein, the half-period signal is a signal detected by a half-period notice unit and showing the timing of a half period from either edge of the external clock signal.

Accordingly, even if the time interval between both edges is not uniform though the period of the external clock signal is accurate, since the timing of a half period from either edge of the external clock signal is accurately detected by the half-period signal, the second clock signal having double the frequency of the first clock signal can be generated precisely on the basis of either edge of the external clock signal. When operating in the second operation mode, too, two operations conducted in one period of the external clock signal can be distributed in uniform time intervals, and set-up time and hold time for each operation can be reserved to a maximum extent.

Effects of the Invention

According to the synchronous storage device and its control method in accordance with the present invention, in the synchronous storage device having the first operation mode and the second operation mode, and operating by switching between these two operation modes, switching of the internal clock signal when switching the operation modes can be included in the count operation period of an initial latency (L), and extra time for switching the internal clock signal is not needed. Additionally, the second clock signal in the second operation mode can be generated precisely. Stable operation and operation mode switching can thereby be easily realized.

BRIEF DESCRIPTION OF THE DRAWINGS

FIG. 8 is a waveform diagram showing a mode of generation of a second clock signal on the basis of a half-period signal (NPS) in internal clock signal generator in FIG. 3 in accordance with the present invention.

DETAILED DESCRIPTION

Figure 1:
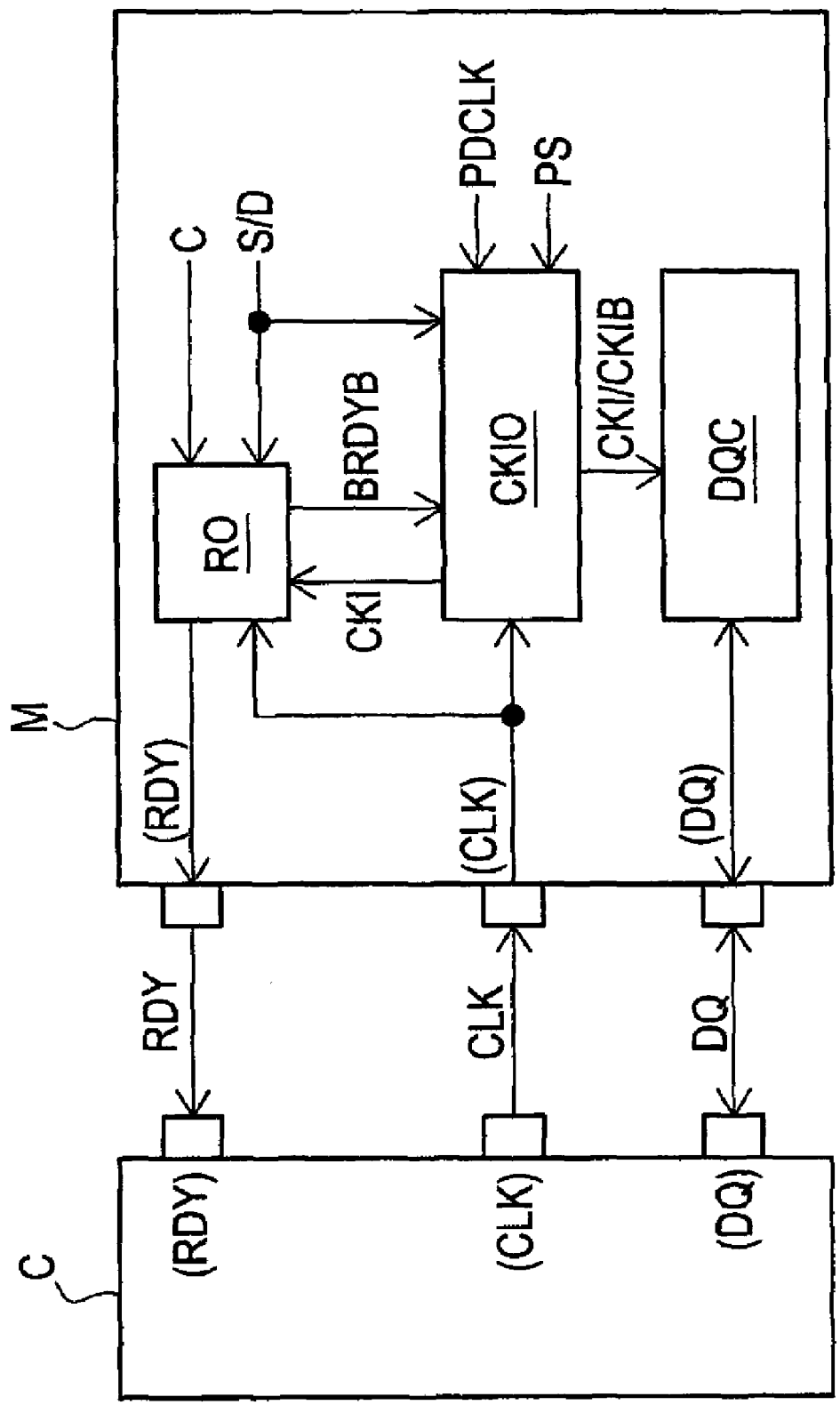
FIG. 1 is a circuit block diagram of a synchronous storage device in accordance with the invention and common to a first and a second embodiment.

First and second embodiments specifically representing the synchronous storage device and its control method in accordance with the present invention are described in detail below while referring to the drawings in FIG. 1 to FIG. 8.

In a nonvolatile storage device such as flash memory, or in a volatile storage device such as DRAM, SRAM, etc., data is read out synchronously with an external clock signal CLK as disclosed in FIG. 1, and such storage device operates as synchronous storage device M. In the synchronous storage device M, at every clock cycle in a stationary state, data is read out from different addresses, sequentially. Generally, external clock signal CLK provides a high speed clock signal and, in order to read out data at every cycle of a high speed clock signal, before the start of the reading operation, internal pre-processing of read data must be finished, such as amplification of data from plural memory cells.

An initial latency (L) after start is set as the time for such pre-processing. The initial latency (L) is generally set by the number of clock cycles of external clock signal CLK after a start command (/AVD, etc.) to incorporate an external address. When the external clock signal CLK passes the number of clock cycles set as initial latency (L), internal pre-processing of read data is finished, and, after initial latency (L) has passed, the output of data DQ is enabled. It is controlled by data input and output control unit DQC. In response to the output of data validity flag indicating completion of internal pre-processing of data DQ to the outside, together with the count of the number of clock cycles of external clock signal CLK, or instead of the count of the number of clock cycles, the memory controller or other system C acknowledges that the output data DQ is valid data. In particular, this flag is necessary when the number of clock cycles of external clock signal CLK is not counted by the system C receiving the data DQ provided from the synchronous storage device M.

The data validity flag herein is a signal provided from the RDY terminal (RDY) shown in FIG. 1 in a nonvolatile storage device such as a flash memory. It is the validity flag (RDY) output unit that issues this data validity flag RDY. The system C monitors the logical level of the signal at RDY terminal (RDY), and can judge whether the data DQ provided from the data terminal (DQ) is valid data or not. During the count period of initial latency (L), the data validity flag is provided after the (L−1)-th clock cycle and before the L-th clock cycle.

The external clock signal CLK is provided into an internal clock signal generator CKIO and internal clocks CKI, CKIB are generated. The internal clocks CKI, CKIB are supplied to a validity flag (RDY) output unit RO, and data input and output control unit DQC.

Figure 2:
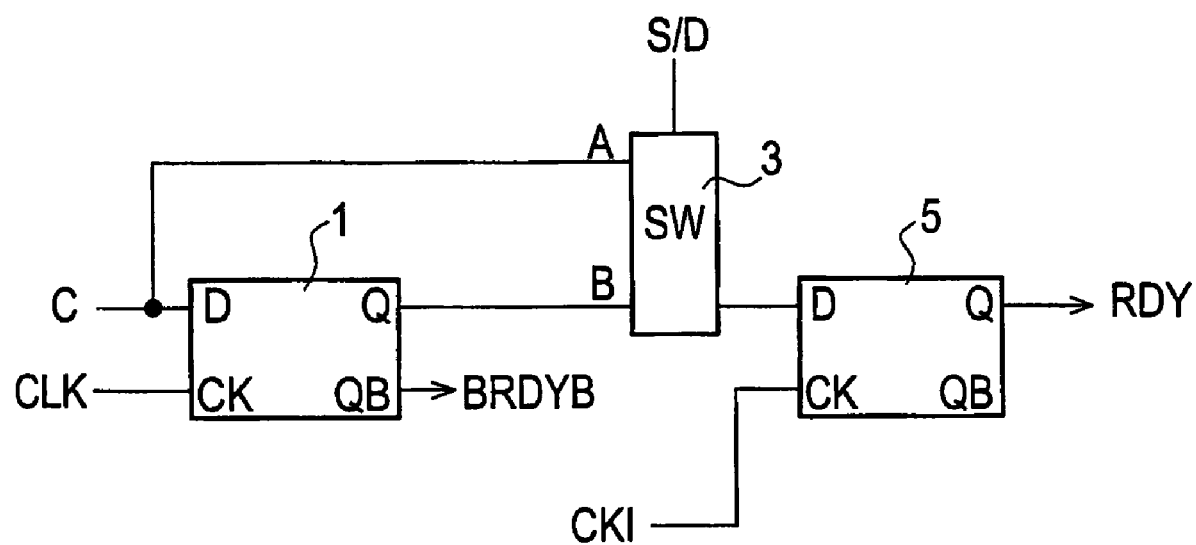
FIG. 2 is a circuit diagram of a validity flag (RDY) output unit in accordance with the invention and common to the first and the second embodiments.

The circuit diagram in FIG. 2 shows a circuit example of validity flag (RDY) output unit RO. This circuit example is applicable to both of the first and second embodiments described below.

A flip-flop circuit 1 switches to a high level as the counter circuit (not shown) for counting the number of clock cycles of external clock signal CLK counts the number of L−2) clock cycles, subtracting 2 from the initial latency (L). The (L−2) count signal C is provided to input terminal D. External clock CLK is provided to clock terminal CK. Therefore, from output terminals Q and QB, one clock cycle behind, an in-phase signal with (L−2) count signal C and a reverse phase signal are provided. These signals are signals for counting the number of (L−1) clocks. The reverse phase signal is provided as (L−1) count signal BRDYB which switches to a low level in response to counting the number of (L−1) clocks. The flip-flop circuit 1 is the (L−n) detector.

The in-phase signal, which switches to a high level in response to counting the number of (L−1) clock cycles, is provided to one input terminal B of a selector 3. The other input terminal A of the selector 3 receives the (L−2) count signal C. The select signal is an operation mode signal S/D. It is at a high level during a SDR operation mode (a first operation mode), and input terminal A is selected. It is at a low level during a DDR operation mode (a second operation mode), and input terminal B is selected.

The output signal from the selector 3 is fed into input terminal D of a flip-flop circuit 5. Internal clock signal CKI is fed into clock terminal CK of the flip-flop circuit 5. The internal clock signal CKI is a clock signal functioning as a synchronous signal in the synchronous storage device as described later. In the SDR operation mode, a clock signal having the same frequency as external clock signal CLK is provided. In the DDR operation mode, a clock signal having double the frequency of external clock signal CLK is provided. The former is a first clock signal, and the latter is a second clock signal. Validity flag RDY is provided from the output terminal Q of the flip-flop circuit 5.

The validity flag (RDY) output unit RO of FIG. 1 is composed of the selector 3 and the flip-flop circuit 5, and includes the flip-flop circuit 1 for forming the (L−n) detector. The validity flag RDY is provided, whether in the SDR operation mode or in the DDR operation mode, in a period after an edge of the external clock signal CLK counting a L−1-th number of clock cycles and before an edge of a L-th clock cycle of CLK, during the count period of initial latency (L).

That is, in the SDR operation mode, (L−2) count signal C switches to a high level in response to counting of the number of (L−2) clock cycles being supplied from the selector 3 into the input terminal D of the flip-flop circuit 5. Later it is provided as a validity flag RDY from the internal clock signal CKI. In the SDR operation mode, since the internal clock signal CKI is a clock signal of the same frequency as the external clock signal CLK, the validity flag RDY is provided after counting (L−1) clock cycles and before completion of counting clock cycles for the initial latency (L).

In the DDR operation mode, the signal switches to a high level in response to the count of the number of (L−1) clock cycles being supplied from the selector 3 into the input terminal D of the flip-flop circuit 5. Later it is provided as validity flag RDY from the internal clock signal CKI. In the DDR operation mode, the internal clock signal CKI is a clock signal having double the frequency of the external clock signal CLK. By operating the internal clock signal CKI at double the frequency in response to the (L−1) count signal BRDYB counting (L−1) clock cycles, the validity flag RDY is provided in the second cycle of the internal clock signal CKI after counting (L−1) clock cycles, that is, in the latter half of the final cycle of the external clock signal CLK. This timing is before completion of counting the initial latency (L). Specific operation waveforms are explained later in connection with FIG. 4 and FIG. 5.

The validity flag (RDY) output unit shown in FIG. 2 is merely an example, and the circuit configuration is not limited to the circuit of FIG. 2. For example, the same action and effect are obtained by connecting the output terminal Q of the flip-flop circuit 1 to the input terminal D of the flip-flop circuit 5, connecting the output terminal Q of the flip-flop circuit 1 and the output terminal Q of the flip-flop circuit 5 to the input terminals A and B of the selector 3, and providing the validity flag RDY from the output terminal of the selector 3.

Further, as described below, depending on the definition of the validity flag (RDY), the value to be subtracted from the initial latency (L) may be a variable of n (n being 1 or greater), that is, (L−n).

Figure 3:
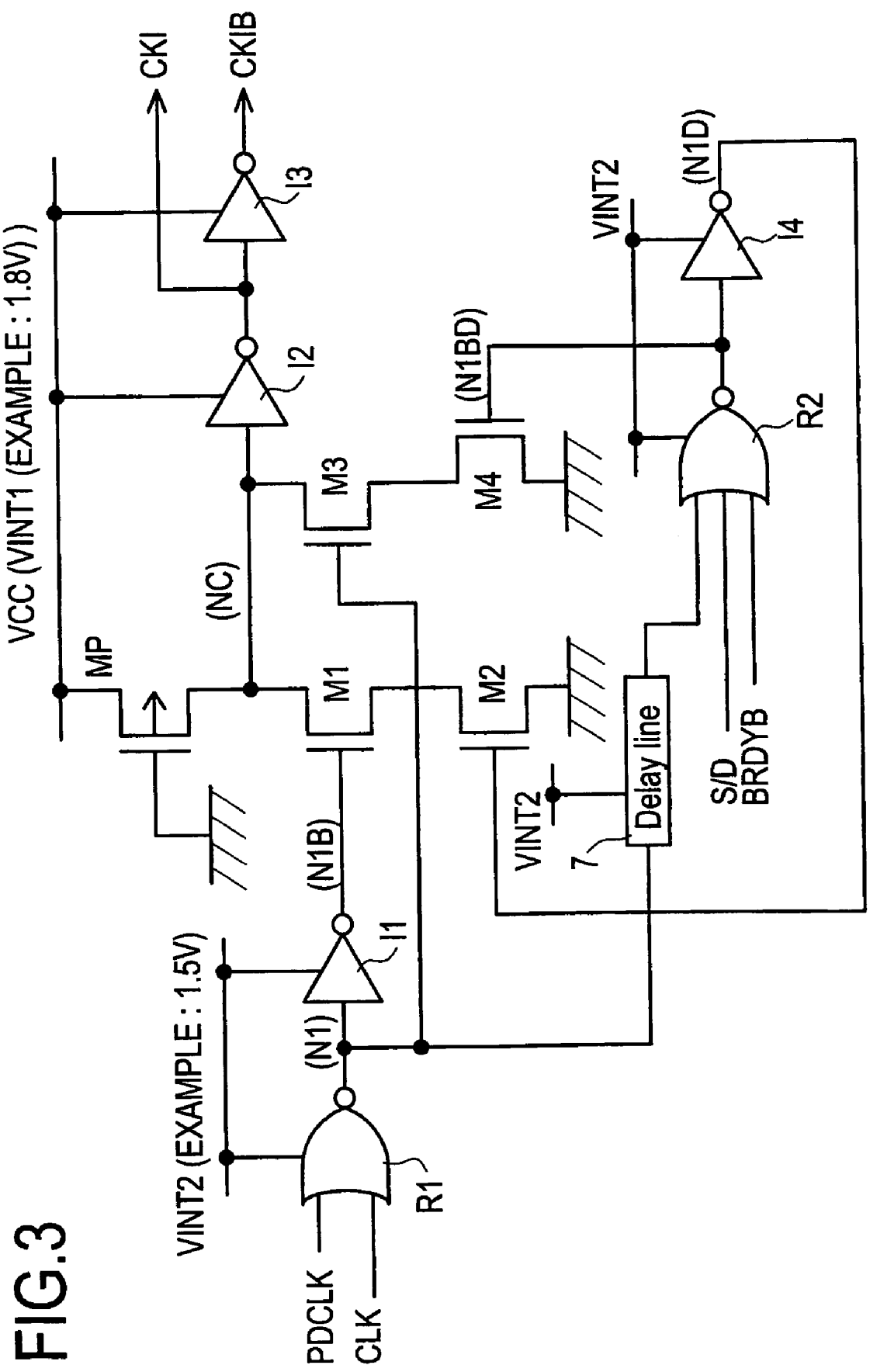
FIG. 3 is a circuit diagram of an internal clock signal generator in accordance with the first embodiment.

FIG. 3 shows an internal clock signal generator in accordance with a first embodiment of the present invention. Two sets of transistor trains (M1 and M2, M3 and M4) connected in series between the output node NC and the ground potential as a lower reference potential make up first and second clock signal generators, together with the PMOS transistor MP as a power supply unit for supplying a higher supply voltage VCC (VINT1 described below) to the output node NC. The gate terminal of PMOS transistor MP is connected, for example, to the ground potential and is always in a conductive state, thereby supplying charge to the output node NC. The output node NC is commonly connected between the first clock signal generator and the second clock signal generator, and a common PMOS transistor MP is connected thereto. The output node NC issues internal clock signal CKI by way of inverter gate 12, and, after further inverting by inverter gate 13, inverted internal clock signal CKIB is provided therefrom.

External clock signal CLK is fed into NOR gate R1 together with pause command signal PDCLK of the external clock signal. When pause command signal PDCLK becomes high and a pause command is provided therefrom, external clock signal CLK is masked and is not propagated inside. When pause command signal PDCLK is low, external clock signal CLK is inverted by way of NOR gate R1 and propagated inside. Inverted signal S (N1) of external clock signal CLK is propagated to node N1, and is fed into the input terminal of inverter gate I1, into the delay unit 7, and into the gate terminal of NMOS transistor M3. From the output terminal of the inverter gate I1, in-phase signal S (N1B) of the external clock signal CLK is provided, and is input into the gate terminal of NMOS transistor I1.

Inverter signal S (N1) inputted into the delay unit 7 is inputted into NOR gate R2 after being provided with a specified delay time. The NOR gate R2 also receives operation mode signal S/D and (L−1) count signal BRDYB. When operation mode signal S/D is low indicating the DDR operation mode and during a count period of initial latency (L), by counting the number of (L−1) clock signal, after transition of (L−1) count signal BRDYB to the low level, NOR gate R2 becomes a logical inverted gate. In reverse phase to inverted signal S (N1), delayed signal S (N1BD) is provided to node N1BD. Node N1BD is connected to the gate terminal of NMOS transistor M4. Further, signal S (N1BD) is inverted by inverter gate I4 and provided as signal S (N1D) into node N1D. Signal S (N1D) is in reverse phase of in-phase signal S (N1B) and is a delayed signal. Node N1D is connected to the gate terminal of NMOS transistor M2.

In the first clock signal generator shown in FIG. 3, since the output node NC is charged to a high level by PMOS transistor MP, in the period of conductive state of both NMOS transistors M1 and M2, and M3 and M4 in series connection for making up the transistor train, the output node NC is extracted to a low level, and the internal clock signal CKI at a high level is provided. When this period is over, the internal clock signal CKI is switched to a low level.

Gate terminals of NMOS transistors M1 and M2 receive signal S (N1B) synchronized with one edge of external clock signal CLK, and delayed signal S (N1D) in reverse phase to signal S (N1B). Therefore, in the period from the high level transition of signal S (N1B) to the low level transition of signal S (N1D), transistors M1 and M2 are both in a conductive state. Gate terminals of NMOS transistors M3 and M4 receive signal S (N1) synchronized with the other edge of external clock signal CLK, and delayed signal S (N1BD) in reverse phase to signal S (N1). Therefore, during the period from the high level transition of signal S (N1) to the low level transition of signal S (N1BD), transistors M3 and M4 are both in a conductive state. This period is determined in response to the delay time provided by the delay unit 7.

The high level transition of signal S (N1B) is synchronized with the high level transition of the external clock signal CLK. The high level transition of signal S (N1) is synchronized with the low level transition of the external clock signal CLK. Therefore, during the period of synchronization with both edges of the external clock signal CLK and nearly coinciding with the delay time given by the delay unit 7, the internal clock signal CKI changes to the high level. Synchronizing with both edges of the external clock signal CLK, a pulse signal at the high level is provided as the internal clock signal CKI, and the internal clock signal CKI becomes a clock signal having double the frequency of the external clock signal CLK.

In the case of setting the SDR operation mode (operation mode signal S/D is at a high level), and/or when the count of the initial latency (L) is less than the number of (L−1) clock signals (when the (L−1) count signal BRDYB is at a high level), the output signal of NOR gate R2 is fixed at a low level. That is, signal S (N1BD) is fixed at a low level, and signal S (N1D) is fixed at a high level. NMOS transistor M4 is maintained in a nonconductive state and NMOS transistor M2 is maintained in a conductive state. In this case, in the transistor train made up of transistors M1 and M2, depending on the conductive period of NMOS transistor M1, the output node NC is extracted to a low level and its inverted signal, that is, the internal clock signal CKI, becomes high. NMOS transistor M1 remains in the conductive state for the period of the high level of signal S (N1B). That is, the internal clock signal CKI clocks the time by synchronizing with the external clock signal CLK. During the SDR operation mode, and/or during the DDR operation mode, when counting of initial latency (L) is less than the number of (L−1) clock signals, the internal clock signal CKI has the same frequency and is synchronized with the external clock signal CLK.

Herein, the NOR gate R2 functions as a first pause unit and signal mask unit. When set in the SDR operation mode, and/or when the count of initial latency (L) is less than the number of (L−1) clock signals, signal S (N1BD) is fixed at a low level and NMOS transistor M4 is maintained in a nonconductive state, and the second clock signal generator including NMOS transistors M3 and M4 is placed in a pause state. Further, signal S (N1D) is fixed at a high level and NMOS transistor M2 is maintained in a conductive state.

Ranks of elements are properly set in two sets of transistor trains (M1 and M2, M3 and M4) connected in series between the output node NC and the ground potential as a lower reference potential. By contrast to FIG. 3, from the output node NC to the ground potential as a lower reference potential, NMOS transistors M2, M1 (M4, M3) may be connected sequentially. Considering the characteristics of NMOS transistors, it seems better for the sake of high speed performance to transfer the NMOS transistor at the output node NC side from a nonconductive state to a conductive state while the NMOS transistor at the lower reference potential side is in a conductive state.

When set in the SDR operation mode, and/or when the count of initial latency (L) is less than the number of (L−1) clock signals, signal S (N1BD) is fixed at a low level, and NMOS transistor M4 at the output node NC side is maintained in a nonconductive state, and if NMOS transistor M3 at the lower reference potential side is set in the conductive state by signal S (N1), voltage fluctuations at the output node NC side are small due to the parasitic capacity between NMOS transistors M4 and M3, and operation is stable.

Elements composed of two sets of transistor trains (M1 and M2, M3 and M4) and PMOS transistor MP may also function as a voltage level shifter. Interface voltages as signal voltage values of external terminals are determined by the system design other than the storage device, and there may be a difference from the internal operation voltage in the storage device. Preferably, the voltage conversion should be processed near the interface signal processing unit of each external terminal in the storage device. In this embodiment, as shown in FIG. 3, the voltage amplitude value of the external clock signal CLK is converted from internal voltage 2 (VINT2; for example, 1.5 V) conforming to an interface voltage to internal voltage 1 (VINT1; for example, 1.8 V) as an internal operation voltage by voltage level shifter composed of two sets of transistor trains (M1 and M2, and M3 and M4) and PMOS transistor MP.

Figure 4:
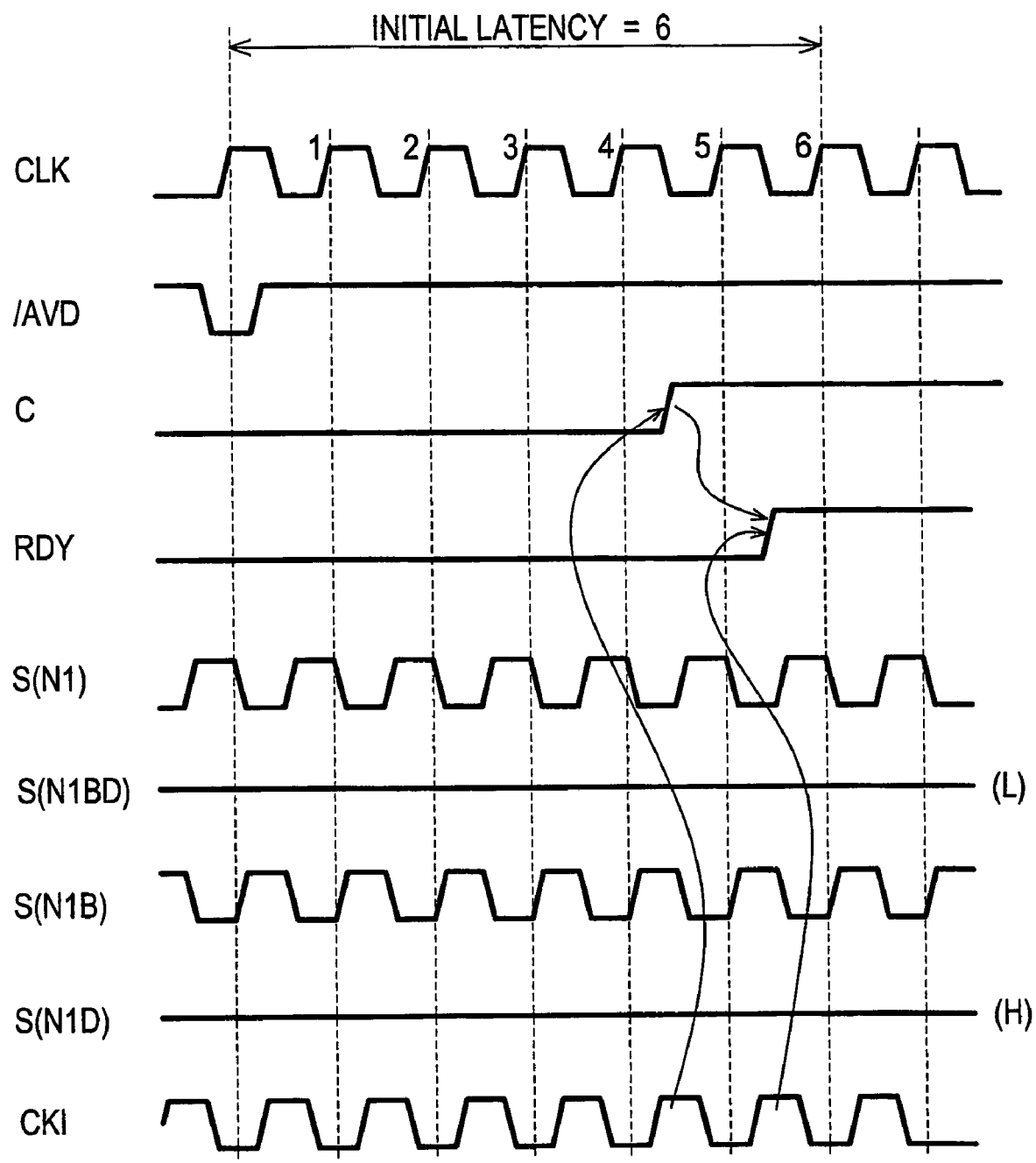
FIG. 4 is a waveform diagram showing SDR operation mode operation in accordance with the present invention in the internal clock signal generator of FIG. 3.
Figure 5:
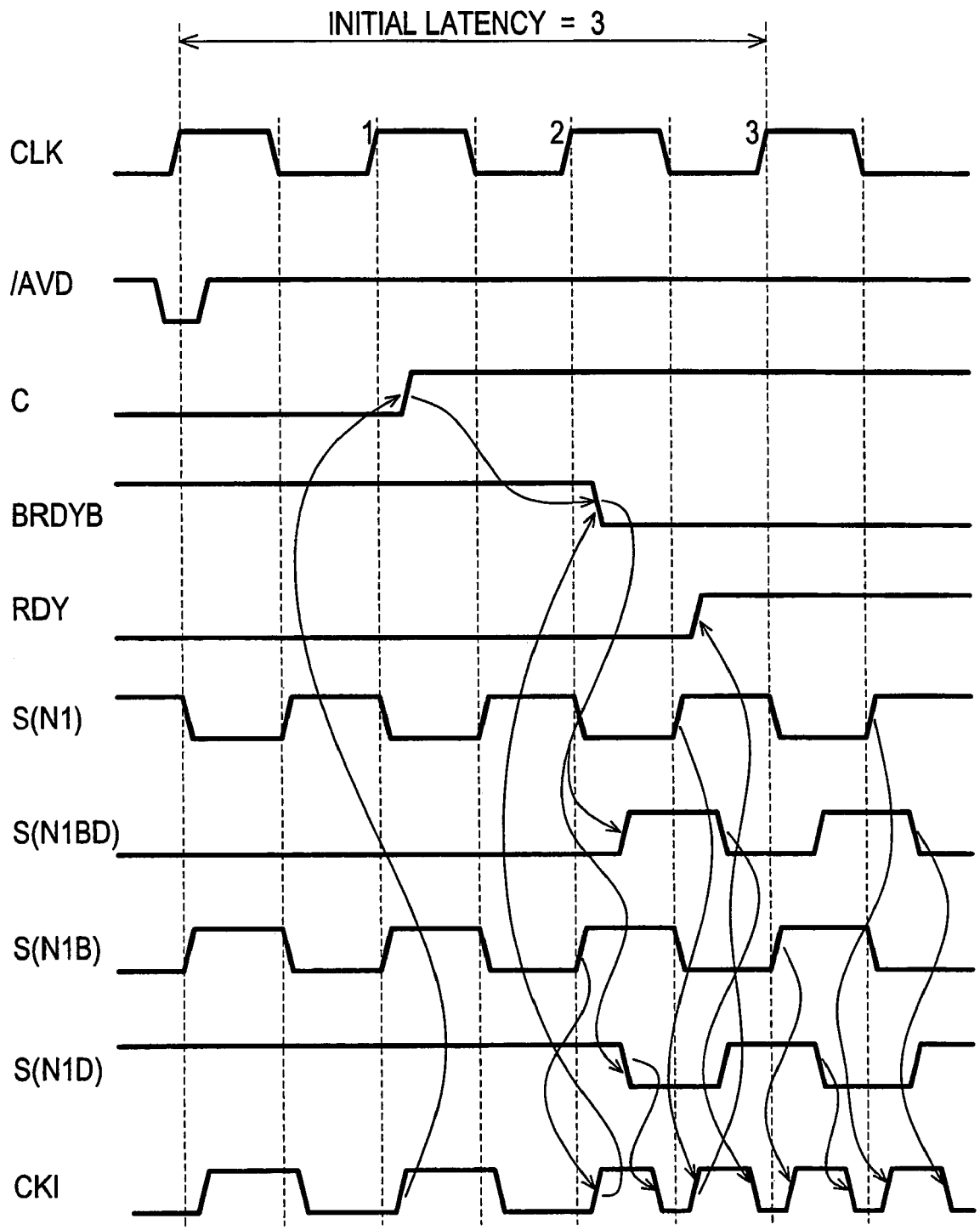
FIG. 5 is a waveform diagram showing DDR operation mode operation in accordance with the present invention in the internal clock signal generator in FIG. 3.

FIG. 4 and FIG. 5 are operation waveforms of the internal clock signal generator (FIG. 3) with settings for the SDR and the DDR operation mode, respectively. Operation in each operation mode is explained by referring to FIG. 2 and FIG. 3.

During SDR operation mode (FIG. 4), the initial latency is 6 (L=6). When four cycles of the external clock signal CLK have been counted (subtracting 2 from the initial latency, (L−2)), count signal C switches to a high level with the rising edge of internal clock signal CKI. It is provided to input terminal D of flip-flop circuit 5 by way of input terminal A of selector 3, and, after one additional cycle of the external clock signal CLK, validity flag RDY provided from the output terminal Q is switched to a high level with the rising edge of internal clock signal CKI.

Since the operation mode signal S/D is at a high level, the output signal from NOR gate R2 is fixed at a low level. NMOS transistor M4 is maintained in a nonconductive state and NMOS transistor M2 is maintained in a conductive state. Internal clock signal CKI switches to a high level in response to the conductive period of NMOS transistor M1. Signal S (NiB) entering the gate terminal is a signal in phase with the external clock signal CLK, and the internal clock signal CKI is thereafter provided as a clock signal of the same frequency as the external clock signal CLK.

During the DDR operation mode (FIG. 5), the initial latency is 3 (L=3). When one cycle of the external clock signal CLK has been counted (subtracting 2 from the initial latency, (L−2)), count signal C switches to a high level with the rising edge of the internal clock signal CKI, same as in the case of SDR operation mode. The (L−2) count signal C entering the input terminal D of flip-flop circuit 1 is provided from output terminal D after one cycle of the external clock signal CLK, and is propagated to input terminal D of flip-flop circuit 5 by way of input terminal B of selector 3. Thus, after one cycle of the internal clock signal CKI, validity flag RDY provided from output terminal Q is switched to a high level.

At this time, the operation mode signal S/D is at a low level. As (L−1) count signal BRDYB is inverted to a low level by flip-flop circuit 1, NOR gate R2 functions as a logical inversion gate. Delayed signal S (N1BD)/S (N1D) in reverse phase to signal S (N1)/S (N1B) is provided. A transistor train composed of NMOS transistors M1 and M2, and M3 and M4 conducts by synchronizing with both edges of the external clock signal CLK, and the internal clock signal CKI having double the frequency of the external clock signal CLK is provided.

Herein, the timing of (L−1) count signal BRDYB inverting to a low level is after counting two cycles of the clock signals, subtracting 1 from the latency (3) during the counting period of initial latency. This is the start point of the final external clock signal cycle during the counting period of initial latency. Later, signal S (N1BD)/S (N1D) is provided. In the period from transition timing of various signals S (N1)/S (N1B) to a high level, to transition timing of signal S (N1BD)/S (N1D), NMOS transistors M1 and M2, M3 and M4 for making up the transistor train conduct commonly and the internal clock signal CKI is switched to a high level.

It is a feature of the first aspect of the invention that the internal clock signal CKI has double the frequency of the external clock signal CLK in the final external clock signal cycle during the count period of initial latency. In DDR operation mode, since data is read out in response to the internal clock signal CKI having double the frequency, and it is required to not falsely recognize that valid data is provided, the data is provided in synchronism with the internal clock signal CKI during the external clock signal cycle immediately before completion of the counting of initial latency (before latency=2.5). Accordingly, waiting for the second cycle (latency=2.5) of the internal clock signal CKI during the external clock signal cycle immediately before completion of the counting of initial latency, it is preferred to change the validity flag RDY to a high level. Hence, at the moment of counting the initial latency (L=3) and at an edge point of the first external clock signal reading out valid data, the validity flag RDY can be changed to a high level.

If it is not necessary to switch between the SDR operation mode and the DDR operation mode, in the internal clock signal generator in FIG. 3, by replacing the NOR gate R2 with an inverter gate for receiving a signal from the delay unit 7, a generating circuit for the internal clock signal CKI corresponding to the DDR operation mode can be created.

Figure 6:
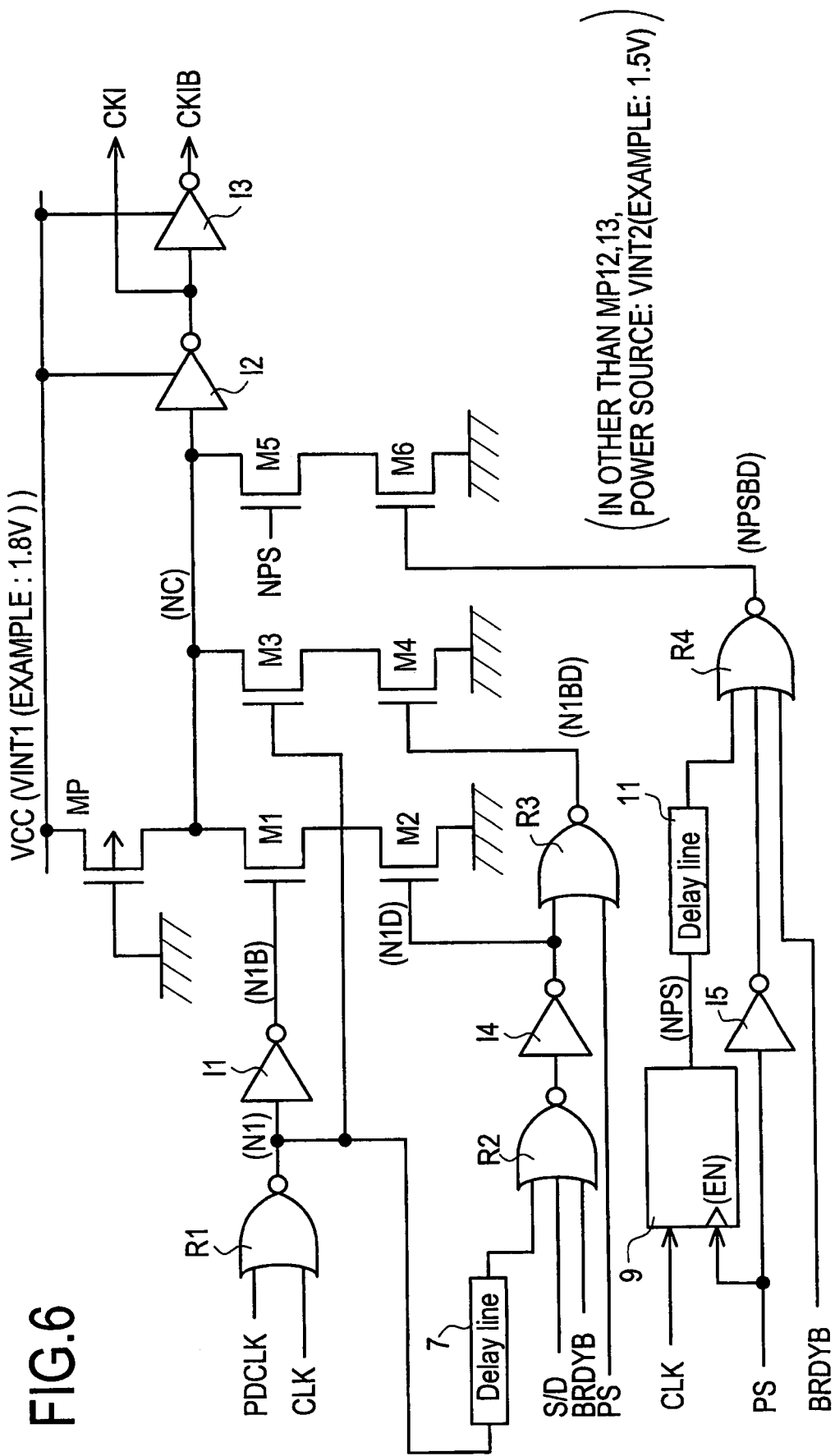
FIG. 6 is a circuit diagram of an internal clock signal generator in accordance with the second embodiment.

FIG. 6 shows an internal clock signal generator in accordance with a second embodiment of the present invention. The second embodiment is similar to the first embodiment, except that the internal clock signal generator further includes the function of detecting the half-period timing of the external clock signal CLK regardless of the time rate of the period of high/low level of the external clock signal CLK, and providing a half-period signal S (NPS) in response thereto. In the DDR operation mode, setting the phase shift signal PS at a low level, similar to the first embodiment, generates the internal clock signal CKI at double the frequency by synchronizing with both edges of the external clock signal CLK. Further, by setting the phase shift signal PS at a high level, it is also possible to provide the internal clock signal CKI at double the frequency by dividing the period of the external clock signal CLK precisely into two sections, regardless of the edge timing of the external clock signal CLK, by making use of the half-period signal S (NPS).

In the second embodiment, in addition to the internal clock signal generator of the first embodiment, two sets of NMOS transistor trains M5 and M6 are provided between the output node NC and the ground potential, and a fourth clock signal generator is created thereby together with PMOS transistor MP. In the second embodiment, the two sets of NMOS transistor trains M1 and M2, M3 and M4 comprise third and fifth clock signal generators.

The gate terminal of NMOS transistor M5 receives the half-period signal S (NPS). The gate terminal of NMOS transistor M6 receives a delayed signal S (NPSBD) in reverse phase to the half-period signal S (NPS). The half-period signal S (NPS) is provided from the half-period detection unit 9. The half-period detection unit 9 is, for example, a DLL circuit, which receives an external clock signal CLK, and when the phase shift signal PS fed in enable terminal EN is at a high level, thereby providing half-period signal S (NPS) to node NPS at a high precision. The half-period signal S (NPS) is put into the gate terminal of NMOS transistor M5, and is also put into NOR gate R4 by way of delay unit 11. The NOR gate R4 receives the phase shift signal PS after being inverted by inverter gate I5, and also receives operation mode signal S/D and the (L−1) count signal BRDYB. The NOR gate R4 provides signal S (NPSBD) therefrom.

In the first embodiment, the output terminals of NOR gate R2 and inverter gate I4 in the internal clock signal generator are node N1BD and node N1D, and the output terminal of inverter gate I4 is connected to the gate terminal of NMOS transistor M2 at node N1D. Further, node N1D is connected to the input terminal of NOR gate R3 along with the phase shift signal PS.

Similar to the first pause unit and signal mask unit of the first embodiment, the NOR gate R2 functions as a second pause unit and signal mask unit. The NOR gate R4 functions as a third pause unit.

Figure 7:
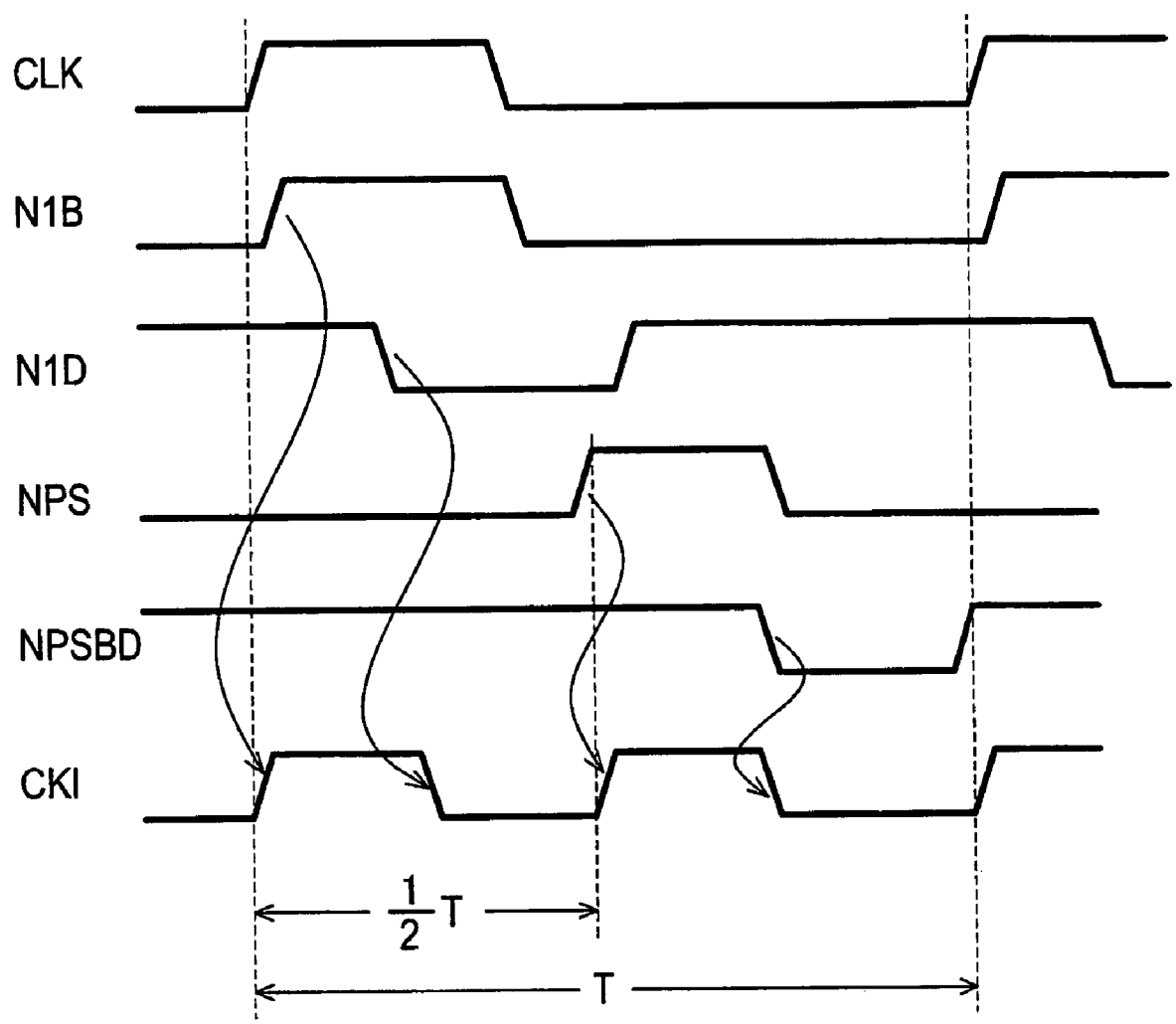
FIG. 7 is a diagram showing settings for each operation mode of internal clock signal generator in FIG. 3 in accordance with the present invention.
Figure 9:
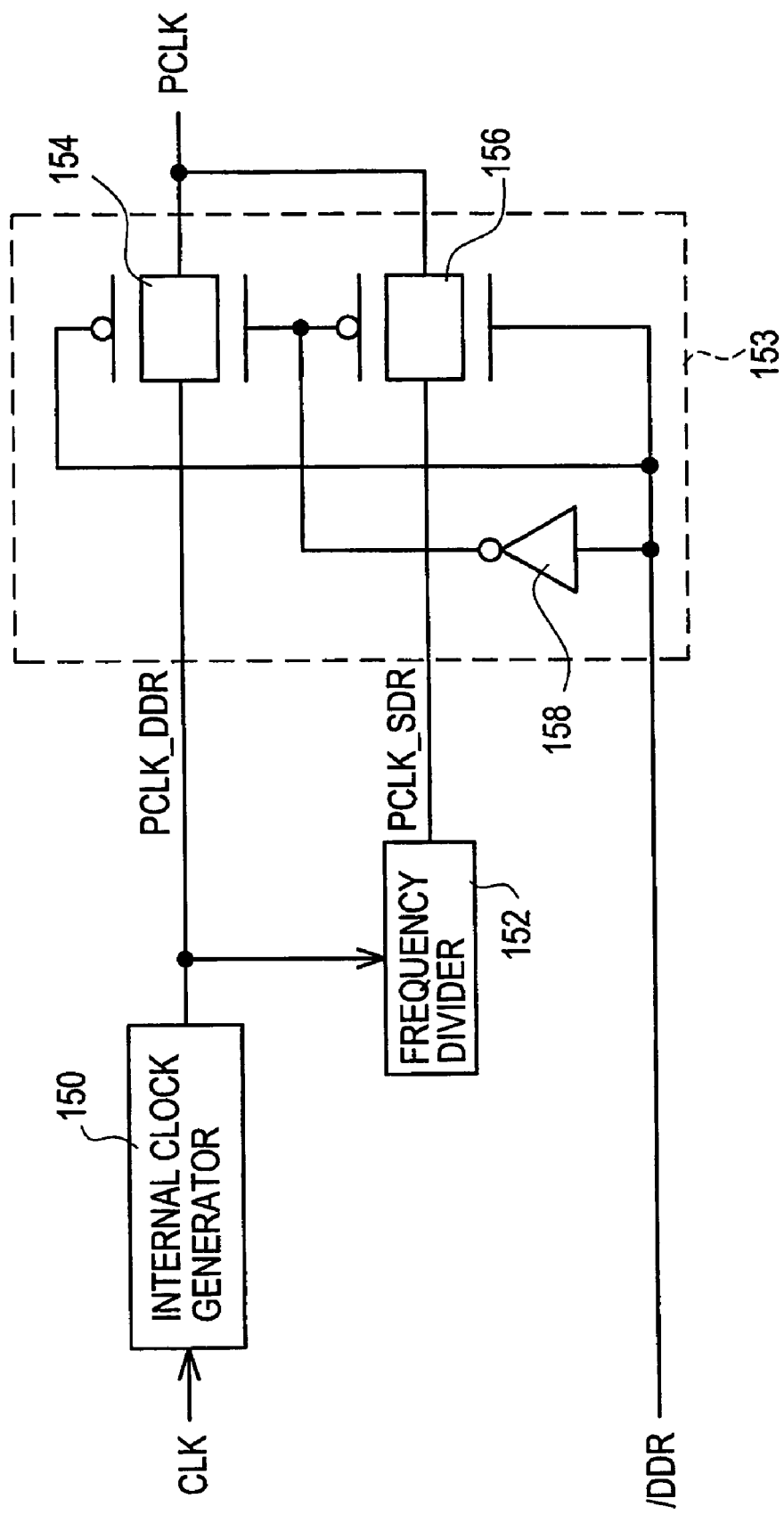
FIG. 9 is a circuit diagram disclosed in Japanese unexamined patent publication No. H11(1999)-213668.

Operation of transistor trains (M1 and M2, M3 and M4) comprising the third and fifth clock signal generators is the same as the operation of transistor trains (M1 and M2, M3 and M4) comprising the first and second clock signal generators of the first embodiment and, accordingly, the explanation is omitted here. Operation waveforms of signal S (NPS) and signal S (NPSBD) for conducting and controlling the transistor train (M5 and M6) comprising the fourth clock signal generator are similar to the operation waveforms of signal S (N1B) and signal S (N1D) as shown in FIG. 7. The operation of transistor train (M5 and M6) comprising the fourth clock signal generator is also the same as the operation of transistor train (M1 and M2) comprising the first clock signal generator in the first embodiment.

The half-period notice unit 9 provides signal S (NPS) precisely at the timing of the half period T/2, during period T of external clock signal CLK. Regardless of the time rate of the period of the high and low level of the external clock signal, period T is equally divided into two sections and internal clock signal CKI having double the frequency can be generated. In DDR operation mode operating in synchronization with internal clock signal CKI at double the frequency, the setup time and hold time of internal clock signal CKI can be reserved to the maximum extent, and a maximum operation allowance is assured.

In the second embodiment, as shown in FIG. 8, by selecting the transistor train to be used in each mode of action, a desired internal clock signal CKI can be obtained. Because of logical sum composition wiring and coupling on the output node NC, the transistor train to be used may be easily selected.

When operation mode signal S/D or (L−1) count signal BRDYB is at a high level, transistor train (M1 and M2) is selected. NMOS transistor M2 is maintained in a conductive state, and the transistor train (M1 and M2) is conducted and controlled at the same frequency as the external clock signal CLK. At this time, transistor trains (M3 and M4, M5 and M6) are in a nonconductive state. Internal clock signal CKI corresponding to the SDR operation mode can then be generated.

When operation mode signal S/D, (L−1) count signal BRDYB, and phase shift signal PS are all at a low level, transistor trains (M1 and M2, M3 and M4) are selected. The transistor train (M1 and M2) and transistor train (M3 and M4) are conducted and controlled in synchronization with one and other edges of external clock signal CLK respectively. At this time, transistor train (M5 and M6) is in a nonconductive state. Internal clock signal CKI can be generated in synchronization with both edges of external clock signal CLK. Internal clock signal CLI corresponding to the DDR operation mode is then generated.

When operation mode signal S/D and (L−1) count signal BRDYB are at a low level, and phase shift signal PS is at a high level, transistor trains (M1 and M2, M5 and M6) are selected. The transistor train (M1 and M2) and transistor train (M5 and M6) are conducted and controlled in synchronization with one edge of external clock signal CLK, and one edge of half-period signal S (NPS), respectively. At this time, transistor train (M3 and M4) is in a nonconductive state. Internal clock signal CKI can be generated in one of the periods generates when the period of external clock signal CLK is precisely divided into two sections. Internal clock signal CLI corresponding to the DDR operation mode is thus generated.

In the second embodiment, in the DDR operation mode, transistor train (M3 and M4) and transistor train (M5 and M6) are selectively provided. However, instead of transistor train (M3 and M4), transistor train (M5 and M6) may be provided.

If it is not necessary to switch between the SDR operation mode and the DDR operation mode, in the internal clock signal generator in FIG. 6, instead of NOR gates R2, R4, an inverter gate for receiving signals from delay units 7, 11 may be provided. Thus, internal clock signal CKI corresponding to the DDR operation mode can be created. In this case, a basic clock signal generator is created by including the transistor train (M1 and M2). Further, a first intermediate clock signal generator is created by including the transistor train (M5 and M6). Moreover, a second intermediate clock signal generator is created by including the transistor train (M3 and M4). Either one of the first intermediate clock signal generator or the second intermediate clock signal generator is selected. Or, if only either one is provided, internal clock signal CKI of double the frequency can be generated.

The invention is not limited to these embodiments alone, but may be changed and modified in various forms without departing from the true spirit of the invention.

For example, in the validity flag (RDY) output unit shown in FIG. 2, external clock signal CLK is fed into the flip-flop circuit 1, and internal clock signal CKI is fed into the flip-flop circuit 5. The invention, however, is not limited to this example. The internal clock signal CKI may be fed into both flip-flop circuits 1 and 5.

In the internal clock signal circuit shown in FIG. 3 and FIG. 6, signal S (N1) is fed into the delay unit 7. But the invention is not limited to this example, and signal S (N1B) may be delayed.

Elements comprising the three sets of transistor trains (M1 and M2, M3 and M4, M5 and M6) and PMOS transistor MP shown in FIG. 6 may also operate as a voltage level shifter.

PMOS transistor MP as a power supply source for supplying higher supply voltage VCC to output node NC shown in FIG. 3 and FIG. 6 is not limited to a PMOS transistor, so long as it is an electrical resistance component.

In the first and second embodiments, when the second operation mode is set by detecting the number of (L−1) clock signals subtracting 1 from the initial latency (L), in response to the detection signal of the number of (L−1) clock signals, the internal clock signal CKI is switched from the first clock signal synchronizing with either edge of the external clock signal CLK to the second clock signal synchronizing with both edges of the external clock signal CLK, but the subtracting number from the initial latency (L) is not limited to one. That is, it may be (L−n) (n being one or greater). In this case, depending on the number of n, the flip-flop circuit 1 in FIG. 2 is increased.

For example, in the DDR operation mode as an example of a second operation mode, in the case of initial latency (L)=4 and n=2, by detecting the number of (L−2) clock signals, when the second operation mode is set by the internal clock signal generator in response to the detection signal of number of (L−2) clock signals, the internal clock signal CKI is switched from the first clock signal synchronizing with one edge of the external clock signal CLK to the second clock signal synchronizing with both edges of external clock signal CLK. Further, in the control method for a synchronous storage device, when counting the initial latency (L) from the start, the method comprises a step of detecting the number of (L−2) clock signals (subtracting 2 from the initial latency (L)) concerning the external clock signal CLK, and a step of switching the internal clock signal CKI from the first clock signal synchronizing with either one edge of external clock signal CLK to a second clock signal synchronizing with both edges of the external clock signal CLK, depending on the step of detecting the number of (L−2) clock signals when the second operation mode is set. As a result, an optimum signal can be generated in response to the regulation of the validity flag (RDY).

The number of n is not limited to an integer, and it may be, for example, 1.5. This would mean that the DDR operation mode is defined in latency in units of 0.5.

What is claimed is:

1. A synchronous storage device capable of switching between a first operation mode for accessing in synchronism with either edge of a pulse of an external clock signal and a second operation mode for accessing in synchronism with both edges of a pulse of the external clock signal, the synchronous storage device comprising:
   an L−n detector for counting pulses of the external clock signal while counting the initial latency (L) from start of accessing, and detecting the number of pulses of the external clock signal (L−n) by subtracting n, wherein n is a numerical value of 1 or greater in increments of 0.5, from the initial latency (L); and
   an internal clock signal generator coupled to the L−n detector for switching an internal clock signal from a first clock signal for synchronizing with either edge of a pulse of the external clock signal to a second clock signal for synchronizing with both edges of a pulse of the external clock signal, in response to the detected signal from the L−n detector when the second operation mode is being set.

2. The synchronous storage device of claim 1 further comprising a validity flag output unit for providing a data validity flag informing validity of output data in response to a second cycle of the second clock signal in the second operation mode.

3. The synchronous storage device of claim 2 wherein the validity flag output unit includes a flip-flop circuit for receiving the detection result from the L−n detector as an input signal, and using the second clock signal provided from the internal clock signal generator as a trigger signal in the second operation mode.

4. The synchronous storage device of claim 1 wherein the internal clock signal generator includes:
   a first clock signal generator for providing a pulse signal in response to a signal synchronizing with one edge of a pulse of the external clock signal and a delayed signal in reverse phase to the signal; and
   a second clock signal generator for providing a pulse signal in response to a signal synchronizing with the other edge of the pulse of the external clock signal and a delayed signal in reverse phase to the signal, and
   wherein the first clock signal is generated in response to the pulse signal provided from the first clock signal generator, and the second clock signal is generated in response to the pulse signals provided from the first and second clock signal generators.

5. The synchronous storage device of claim 4 wherein the first and second clock signal generators include:
   a power supply unit for supplying a high potential supply voltage to an output node; and
   a transistor train having two NMOS transistors connected in series between the output node and a low reference potential, and
   wherein a signal synchronizing with one edge of the external clock signal, a delayed signal in reverse phase to the signal, a signal synchronizing with the other edge of the external clock signal, and a delayed signal in reverse phase to the signal are connected to the gate terminal of each NMOS transistor of the transistor train.

6. The synchronous storage device of claim 5 wherein the power supply unit supplies a supply voltage at a voltage level different from a voltage level of a high level of the external clock signal.

7. The synchronous storage device of claim 5 wherein the output node is a common node between the first and second clock signal generators, and the power supply unit is commonly coupled to both the first and second clock signal generators.

8. The synchronous storage device of claim 5 further comprising a first pause unit for suspending the second clock signal generator in response to the detection signal not being provided from the L−n detector, and/or in response to the first operation mode.

9. The synchronous storage device of claim 8, wherein the first pause unit masks one of at least either the signal synchronizing with the other edge of the external clock signal or the delayed signal in reverse phase to the signal, and the first pause unit renders nonconductive at least one of the NMOS transistors comprising the transistor train of the second clock signal generator.

10. The synchronous storage device of claim 5 further comprising a signal mask unit for masking the delayed signal in reverse phase to the signal synchronizing with one edge of the external clock signal, and for maintaining the conductive state of the NMOS transistors comprising the transistor train of the first clock signal generator when the detection signal is not provided from the (L−n) detector, and/or during the first operation mode.

11. The synchronous storage device of claim 1 wherein the internal clock signal generator includes:
   a third clock signal generator for providing a pulse signal in response to a signal synchronizing with the one edge of the external clock signal and a delayed signal in reverse phase to the signal;
   a half-period notice unit for providing a half-period signal in response to detecting the timing of a half period from one edge of the external clock signal; and
   a fourth clock signal generator for providing a pulse signal in response to the half-period signal and a delayed signal in reverse phase to the half-period signal, and
   wherein the first clock signal is generated in response to the pulse signal provided from the third clock signal generator, and wherein the second clock signal is generated in response to the pulse signals provided from the third and fourth clock signal generators.

12. The synchronous storage device of claim 11 wherein the third and fourth clock signal generators each include:
   a power supply unit for supplying a high potential supply voltage to an output node of the third or fourth clock signal generators; and
   a transistor train having two NMOS transistors connected in series between the output node and a low reference potential, and
   wherein a signal synchronizing with the one edge of the external clock signal, a delayed signal in reverse phase to the signal, the half-period signal, and a delayed signal in reverse phase to the half-period signal are supplied to the gate terminal of each NMOS transistor of the transistor train.

13. The synchronous storage device of claim 12 wherein the power supply unit supplies a different voltage level from the voltage level of a high level of the external clock signal.

14. The synchronous storage device of claim 12 wherein the output node is a common node between the third and fourth clock signal generators, and the power supply unit is commonly coupled to both the third and fourth clock signal generators.

15. The synchronous storage device of claim 12 further comprising a second pause unit for suspending the fourth clock signal generator when the detection signal is not provided from the (L−n) detector, and/or during the first operation mode.

16. The synchronous storage device of claim 15 wherein the second pause unit suspends the half-period notice unit, and/or masks at least one of the half-period signal and the delayed signal in reverse phase to the half-period signal, while rendering at least one of the NMOS transistors comprising the transistor train of the fourth clock signal generator nonconductive.

17. The synchronous storage device of claim 12, further comprising a signal mask unit for masking the delayed signal in reverse phase to the signal synchronizing with the one edge of the external clock signal, and maintaining the conductive state of the NMOS transistors comprising the transistor train of the third clock signal generator when the detection signal is not provided from the (L−n) detector, and/or during the first operation mode.

18. The synchronous storage device of claim 11 further comprising:
   a fifth clock signal generator for providing a pulse signal in response to a signal synchronizing with the other edge of the external clock signal and a delayed signal in reverse phase to the signal,
   wherein the second clock signal is generated by selection of a pulse signal provided from either the fourth or the fifth clock signal generator.

19. The synchronous storage device of claim 18 wherein the fifth clock signal generator includes:
   a power supply unit for supplying a high potential supply voltage to the output node; and
   a transistor train having two NMOS transistors connected in series between the output node and a low reference potential; and
   a signal synchronizing with the other edge of the external clock signal and a delayed signal in reverse phase to the signal are connected to the gate terminal of each NMOS transistor of the transistor train.

20. The synchronous storage device of claim 18 wherein the output node is a common node among the third, the fourth and the fifth clock signal generators, and the power supply unit is commonly coupled to the third, the fourth and the fifth clock signal generators.

21. The synchronous storage device of claim 19, further comprising a third pause unit for suspending the fifth clock signal generator when the detection signal is not provided from the L−n detector, and/or during the first operation mode.

22. The synchronous storage device of claim 21 wherein the third pause unit suspends the signal synchronizing with the other edge of the external clock signal and masks at least one of the signal synchronizing with the other edge of the external clock signal, and the delayed signal in reverse phase to the signal, and renders at least one of the NMOS transistors comprising the transistor train of the fifth clock signal generator nonconductive.

23. A synchronous storage device for accessing in synchronism with both edges of an external clock signal comprising:
   a basic clock signal generator for providing a pulse signal in response to a signal synchronizing with one edge of the external clock signal and a delayed signal in reverse phase to the signal;
   a half-period notice unit for providing a half-period signal by detecting the timing of a half period from one edge of the external clock signal; and
   a first intermediate clock signal generator for providing a pulse signal in response to the half-period signal and a delayed signal in reverse phase to the half-period signal,
   wherein a second clock signal is generated in response to the pulse signals provided from the basic clock signal generator and the first intermediate clock signal generator.

24. The synchronous storage device of claim 23 further comprising a second intermediate clock signal generator for providing a pulse signal in response to a signal synchronizing with the other edge of the external clock signal and a delayed signal in reverse phase to the signal,
    wherein the second clock signal is generated by selection of a pulse signal provided from either the first intermediate clock signal generator or the second intermediate clock signal generator.

25. A control method of a synchronous storage device capable of switching between a first operation mode for accessing in synchronism with either edge of an external clock signal and a second operation mode for accessing in synchronism with both edges of the external clock signal, the control method comprising the steps of:
    detecting the number of clock signals (L−n), by subtracting n (n having a numerical value of 1 or higher at increments of 0.5) from the initial latency (L), about the external clock signal, the initial latency (L) being counted from start; and
    in the second operation mode, switching the internal clock signal from a first clock signal for synchronizing with either edge of the external clock signal to a second clock signal for synchronizing with both edges of the external clock signal in response to the step of detecting the number of clock signals (L−n).

26. The control method of the synchronous storage device of claim 25 further comprising the step of detecting validity of output data in response to a second cycle after the internal clock signal is changed over to the second clock signal in the second operation mode.

27. The control method of the synchronous storage device of claim 25 wherein the step of switching the internal clock signal from the first clock signal to the second clock signal includes the steps of:
    generating the internal clock signal by generating a pulse signal in response to a signal synchronizing with one edge of the external clock signal and a delayed signal in reverse phase to the signal and further including the step of:
    when switching the internal clock signal, generating a pulse signal and adding to the internal clock signal, in response to a signal synchronizing with other edge of the external clock signal and a delayed signal in reverse phase to the signal.

28. The control method of the synchronous storage device of claim 27 wherein the step of shifting a voltage level from a voltage amplitude value of the external clock signal is included in the step of the internal clock signal by generating a pulse signal in response to a signal synchronizing with one edge of the external clock signal and a delayed signal in reverse phase to the signal, and the step of generating a pulse signal and adding to the internal clock signal in response to a signal synchronizing with the other edge of the external clock signal and a delayed signal in reverse phase to the signal.

29. The control method of the synchronous storage device of claim 25, wherein the step of switching the internal clock signal from the first clock signal to the second clock signal includes the steps of:
    obtaining the internal clock signal by generating a pulse signal in response to a signal synchronizing with one edge of the external clock signal and a delayed signal in reverse phase to the signal, and further including the steps of:
    when switching the internal clock signal,
    determining the timing of a half period from one edge of the external clock signal; and
    generating a pulse signal and adding to the internal clock signal in response to the signal obtained by the step of detecting the timing of the half period and a delayed signal in reverse phase to the signal.

30. The control method of the synchronous storage device of claim 29, further comprising the steps of:
    generating a pulse signal and adding to the internal clock signal in response to a signal synchronizing with the other edge of the external clock signal and a delayed signal in reverse phase to the signal; and
    selecting either generating a pulse signal or adding to the internal clock signal step in response to a signal obtained at the step of detecting the timing of the half period and a delayed signal in reverse phase to the signal.

31. A control method of a synchronous storage device for accessing in synchronism with both edges of an external clock signal, the control method comprising the steps of:
    obtaining an internal clock signal by generating a pulse signal in response to a signal synchronizing with one edge of the external clock signal and a delayed signal in reverse phase to the signal;
    detecting the timing of a half period from one edge of the external clock signal; and
    generating a pulse signal and adding to the internal clock signal in response to a signal obtained at the step of detecting the timing of the half period and a delayed signal in reverse phase to the signal.

32. The control method of the synchronous storage device of claim 31 further comprising the steps of:
    generating a pulse signal and adding to the internal clock signal in response to a signal synchronizing with the other edge of the external clock signal and a delayed signal in reverse phase to the signal; and
    selecting either generating a pulse signal step in response to a signal obtained during the step of detecting the timing of the half period and a delayed signal in reverse phase to the signal.

* * * * *